(12) United States Patent
Kondou et al.

(10) Patent No.: US 7,479,693 B2
(45) Date of Patent: Jan. 20, 2009

(54) ARRANGEMENT OF CONDUCTIVE CONNECTORS IN A POWER SEMICONDUCTOR DEVICE

(75) Inventors: Makoto Kondou, Fukuoka (JP); Kiyoshi Arai, Tokyo (JP); Jose Saiz, Aureilhan (FR); Pierre Solomalala, Aureilhan (FR); Emmanuel Dutarde, Laloubere (FR); Benoit Boursat, Bizanos (FR); Philippe Lasserre, Ousse (FR)

(73) Assignees: Mitsubishi Denki Kabushiki Kaisha, Chiyoda-Ku, Tokyo (JP); Alstom Transport SA, Levallois-Perret (FR)

( * ) Notice: Subject to any disclaimer, the term of this patent is extended or adjusted under 35 U.S.C. 154(b) by 8 days.

(21) Appl. No.: 11/220,788

(22) Filed: Sep. 8, 2005

(65) Prior Publication Data

US 2006/0220213 A1 Oct. 5, 2006

(30) Foreign Application Priority Data

Mar. 15, 2005 (JP) ............................. 2005-072517

(51) Int. Cl.
*H01L 23/48* (2006.01)

(52) U.S. Cl. .................. 257/691; 257/678; 257/733; 257/787; 257/796; 257/E23.001; 257/E23.194

(58) Field of Classification Search ............. 257/778, 257/691, 678, 679, E23.001, E23.194
See application file for complete search history.

(56) References Cited

U.S. PATENT DOCUMENTS

| | | | | |
|---|---|---|---|---|
| 5,166,773 A | * | 11/1992 | Temple et al. ............... | 257/678 |
| 5,539,220 A | * | 7/1996 | Takahashi ..................... | 257/177 |
| 5,854,507 A | * | 12/1998 | Miremadi et al. ............ | 257/686 |
| 6,060,772 A | * | 5/2000 | Sugawara et al. ............ | 257/678 |
| 6,097,097 A | * | 8/2000 | Hirose ......................... | 257/778 |
| 6,278,179 B1 | | 8/2001 | Mermet-Guyennet | |
| 6,286,206 B1 | * | 9/2001 | Li ................................ | 29/840 |
| 6,344,686 B1 | | 2/2002 | Schaeffer et al. | |
| 6,589,859 B2 | | 7/2003 | Petitbon et al. | |
| 6,885,096 B2 | | 4/2005 | Hirahara et al. | |
| 2003/0164551 A1 | * | 9/2003 | Lee et al. ..................... | 257/778 |
| 2003/0214028 A1 | * | 11/2003 | Brechignac et al. ......... | 257/706 |
| 2005/0067714 A1 | * | 3/2005 | Rumer et al. ................ | 257/778 |

(Continued)

FOREIGN PATENT DOCUMENTS

JP 6-181286 6/1994

(Continued)

*Primary Examiner*—Wai-Sing Louie
*Assistant Examiner*—Marc Armand
(74) *Attorney, Agent, or Firm*—Buchanan Ingersoll & Rooney PC

(57) ABSTRACT

One of the aspects of the present invention is to provide a power semiconductor device, including a first substrate having a first circuit pattern formed thereon, and a second substrate having a second circuit pattern formed thereon. The first substrate has a first center line extending along a predetermined transverse direction. At least one power semiconductor chip is mounted on the first circuit pattern of the first substrate, and has at least one chip electrode opposing to the second circuit pattern of the second substrate. Also, a plurality of first conductive connectors on the first circuit pattern is provided for electrical connection with the second circuit pattern of the second substrate. The first conductive connectors are arranged symmetrically in relative to the first center line of the first substrate.

25 Claims, 14 Drawing Sheets

U.S. PATENT DOCUMENTS

2005/0146027 A1    7/2005    Kondou et al.

FOREIGN PATENT DOCUMENTS

| | | |
|---|---|---|
| JP | 10-056131 | 2/1998 |
| JP | 2000-068447 | 3/2000 |
| JP | 2000-124398 | 4/2000 |
| JP | 2000-323630 | 11/2000 |

* cited by examiner

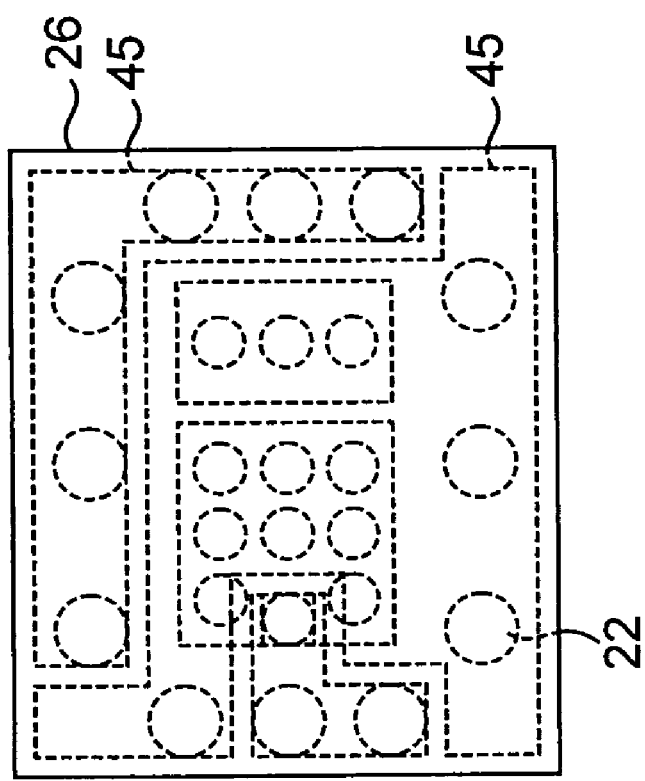
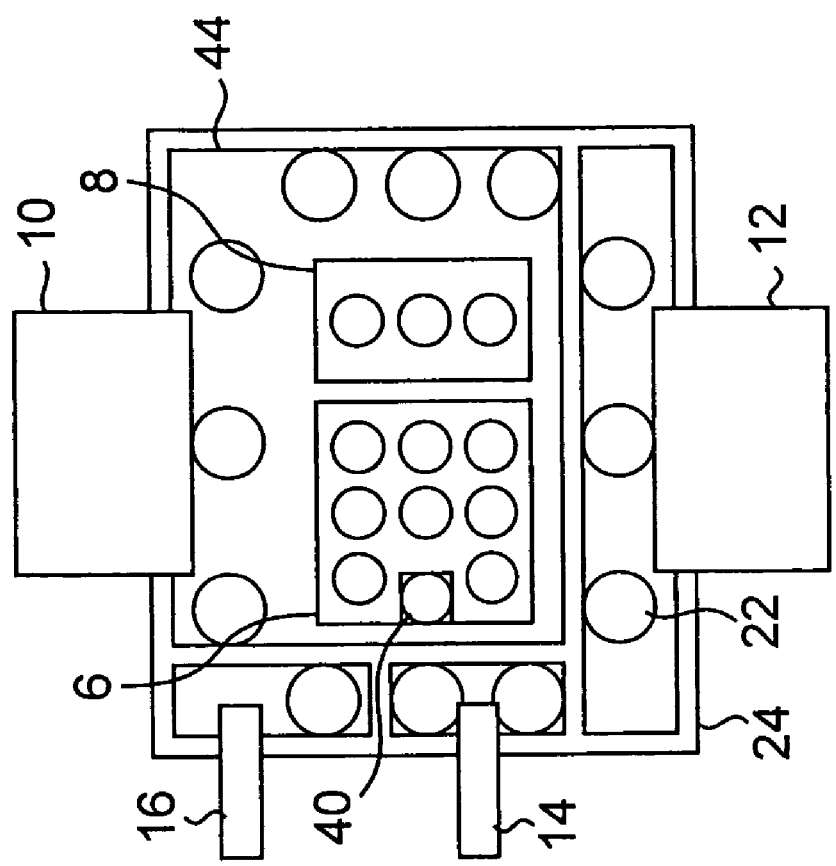
Fig.1A
Fig.1B

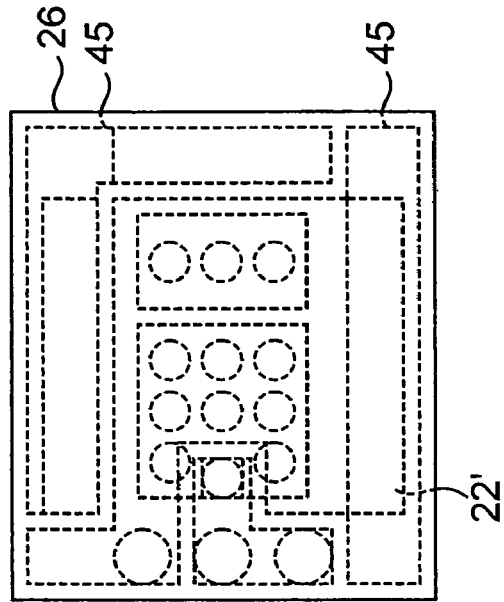
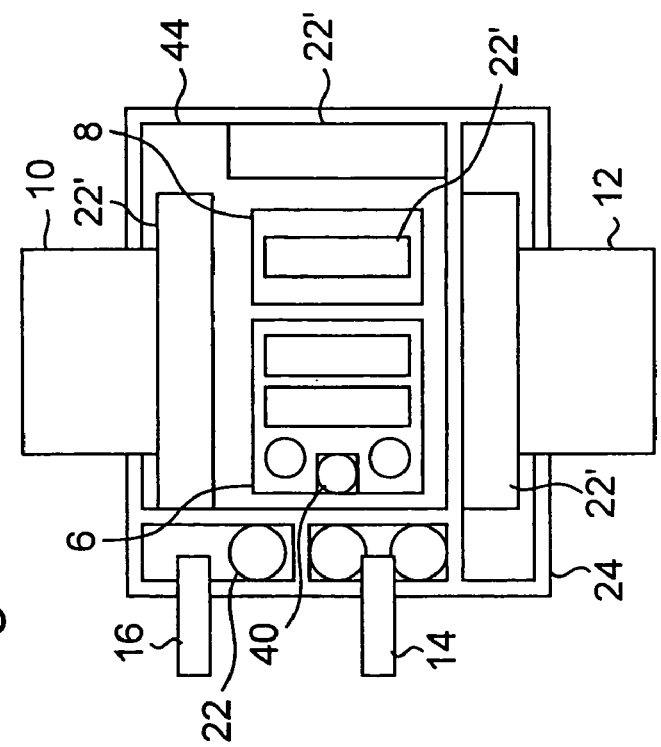
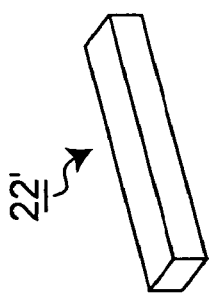

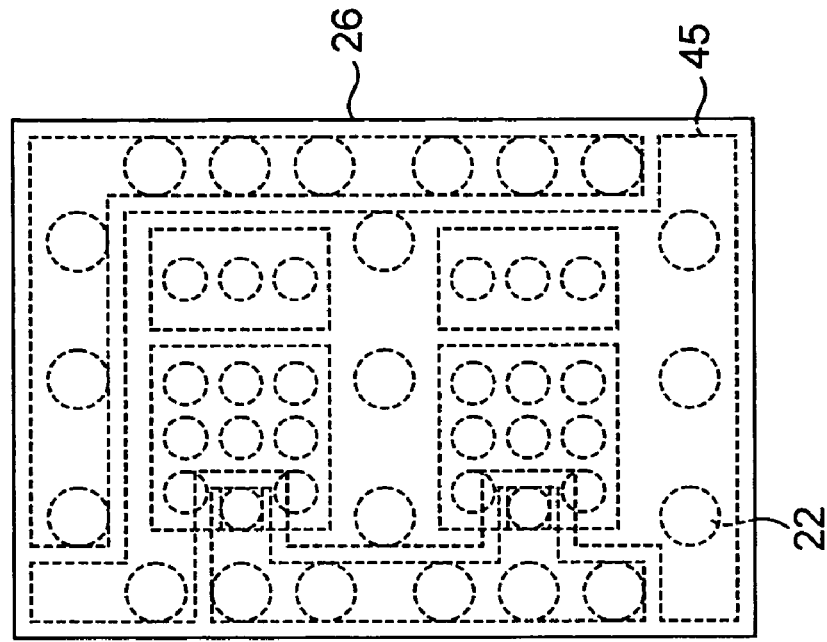
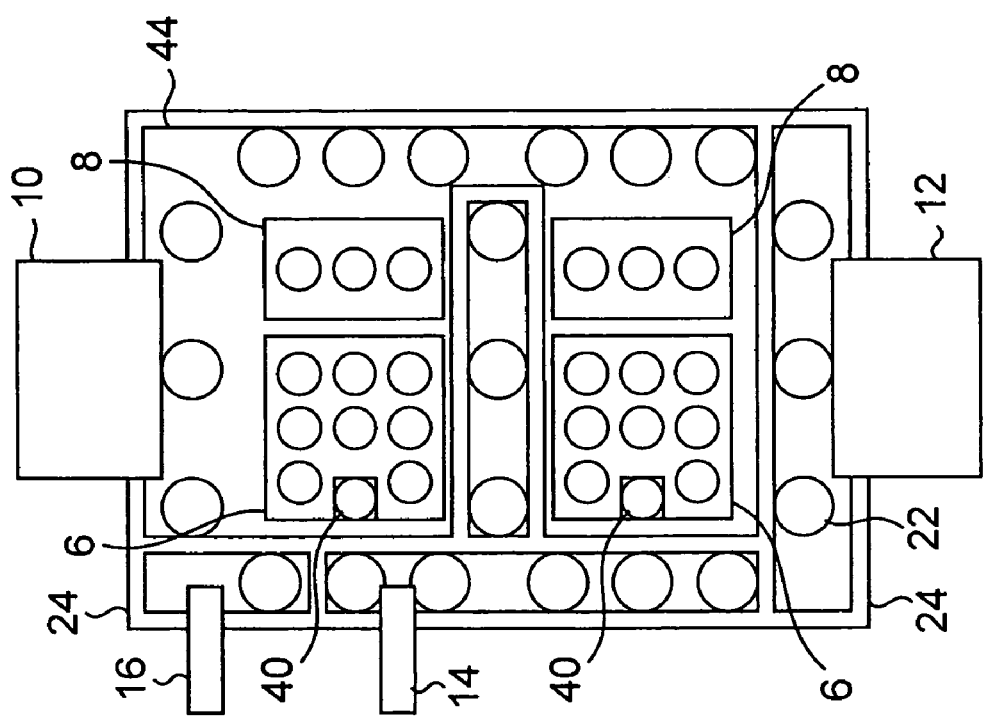

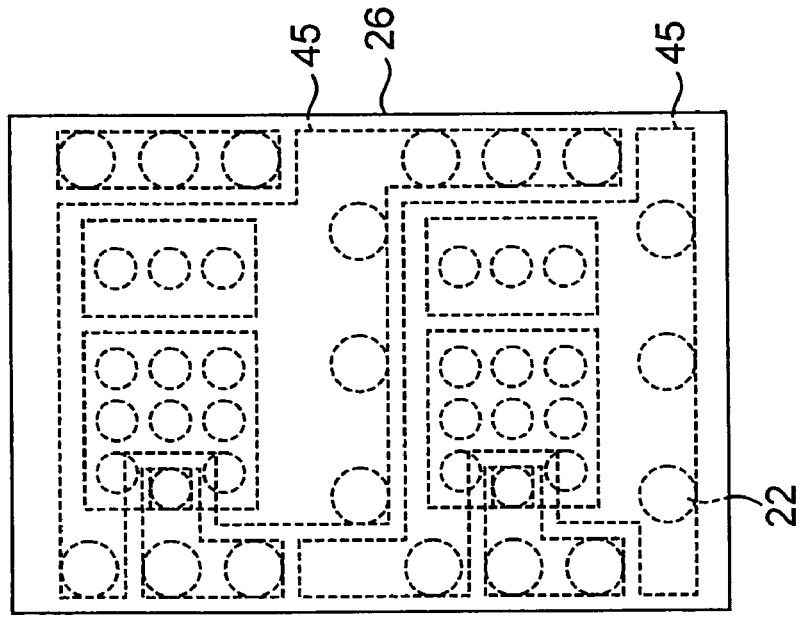
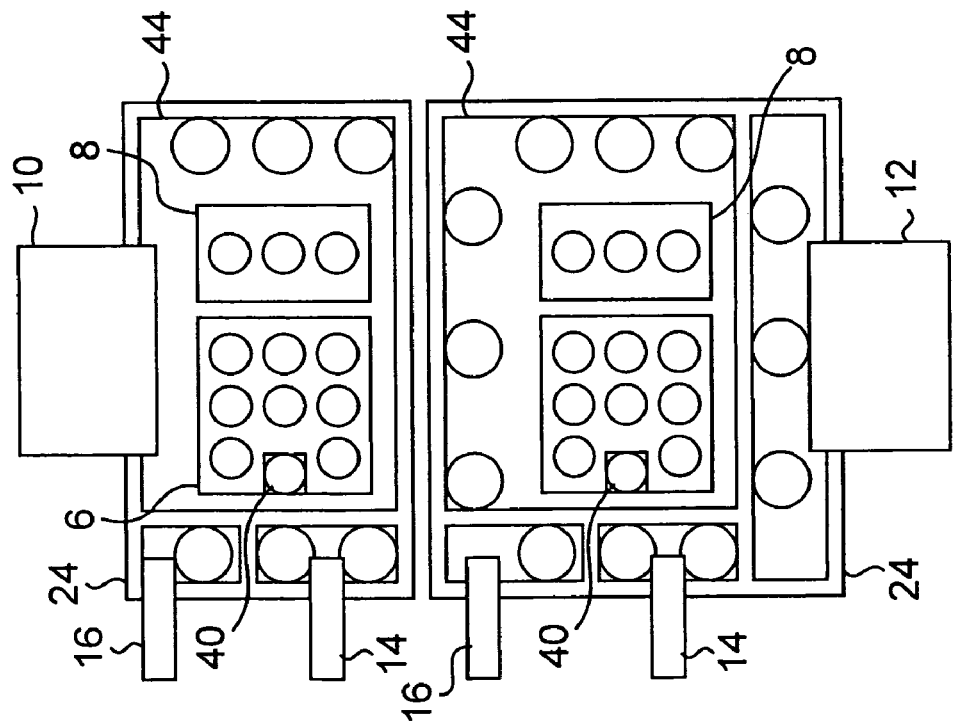
Fig.4B
Fig.4A

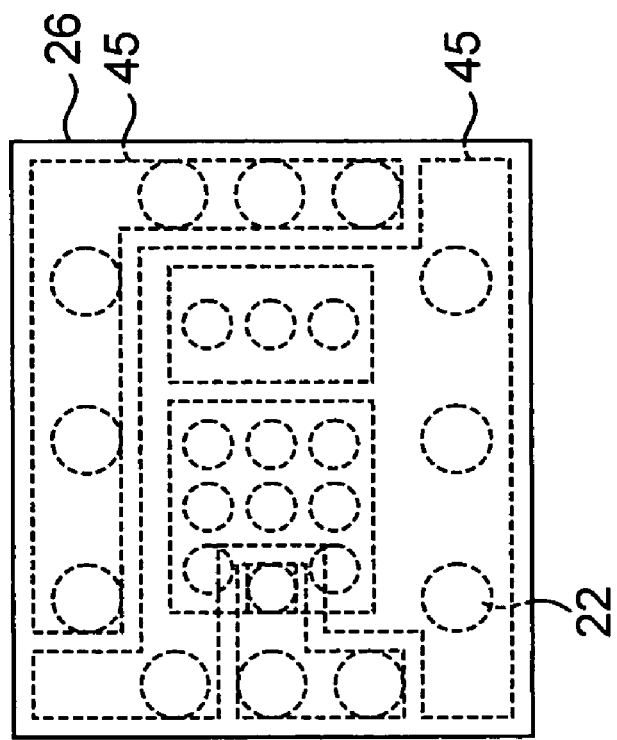

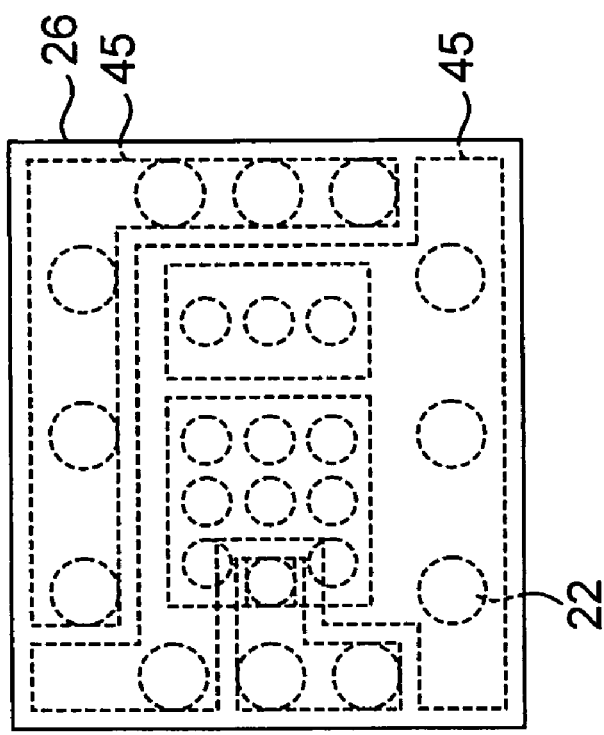
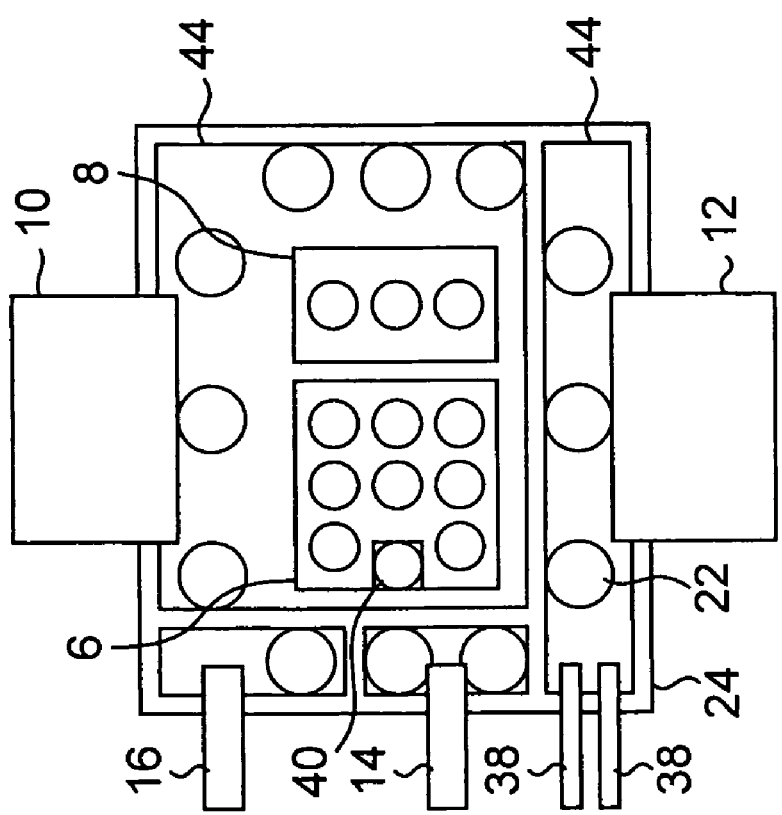

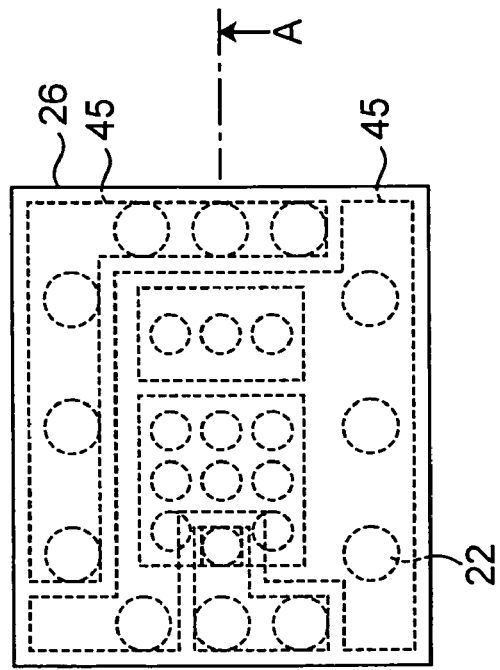
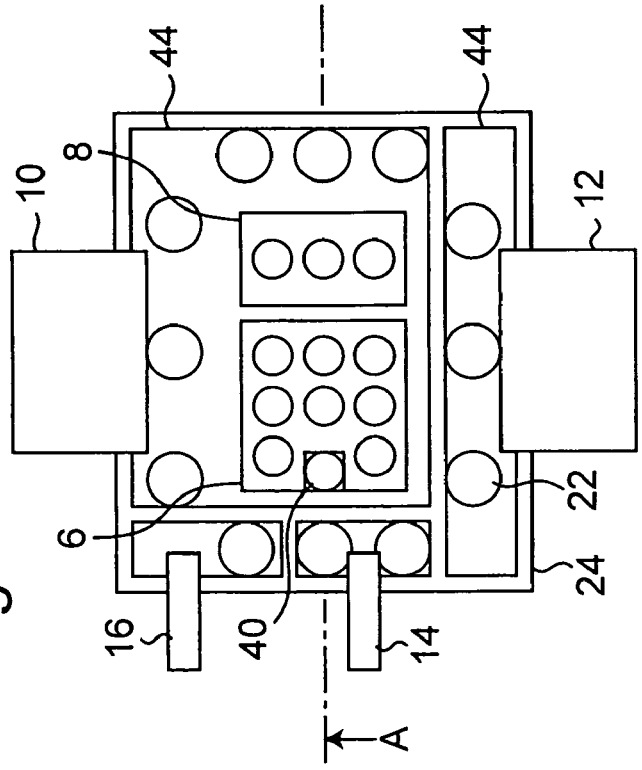
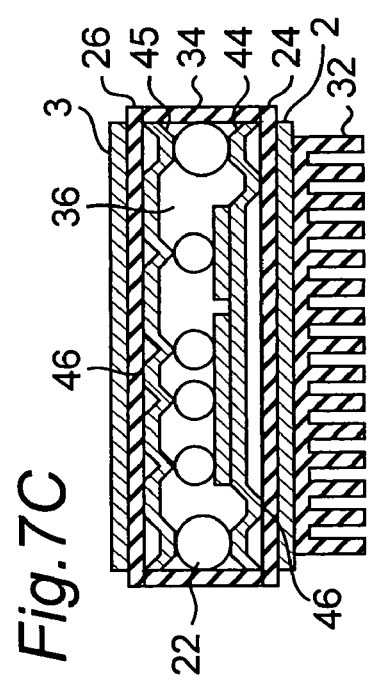

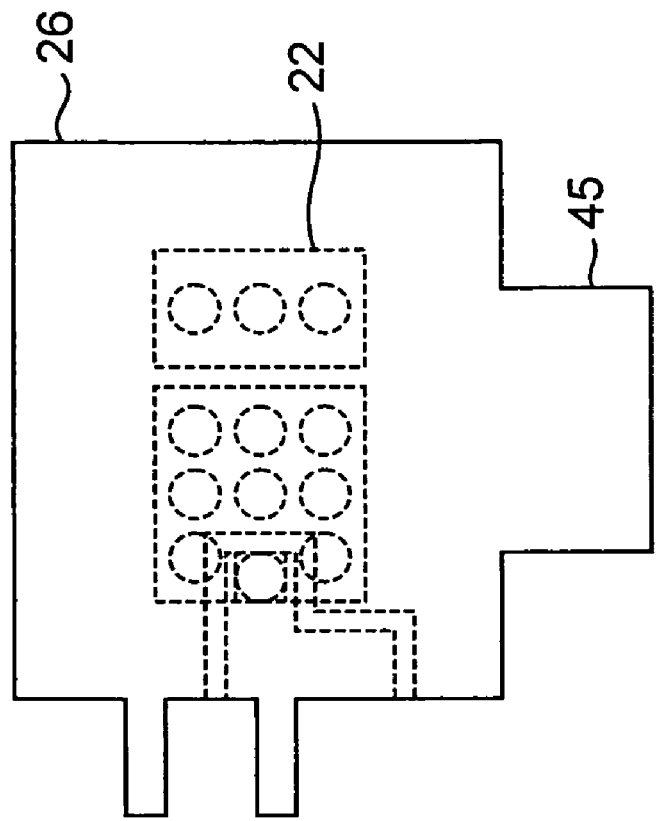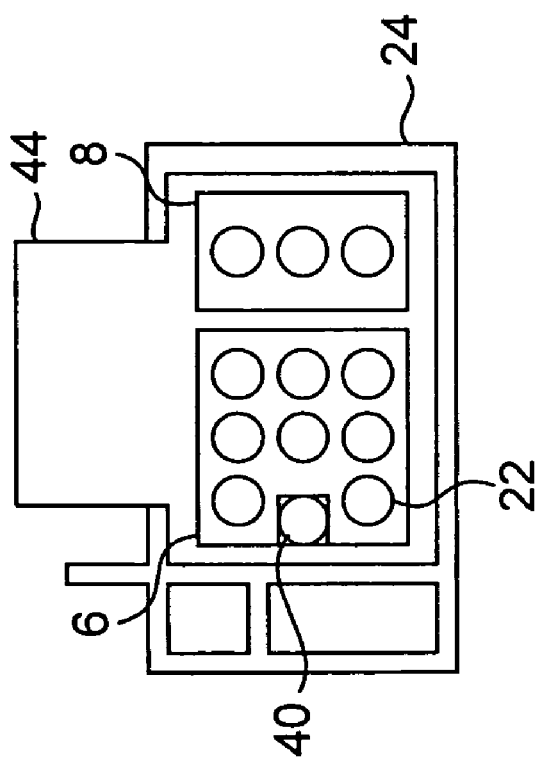

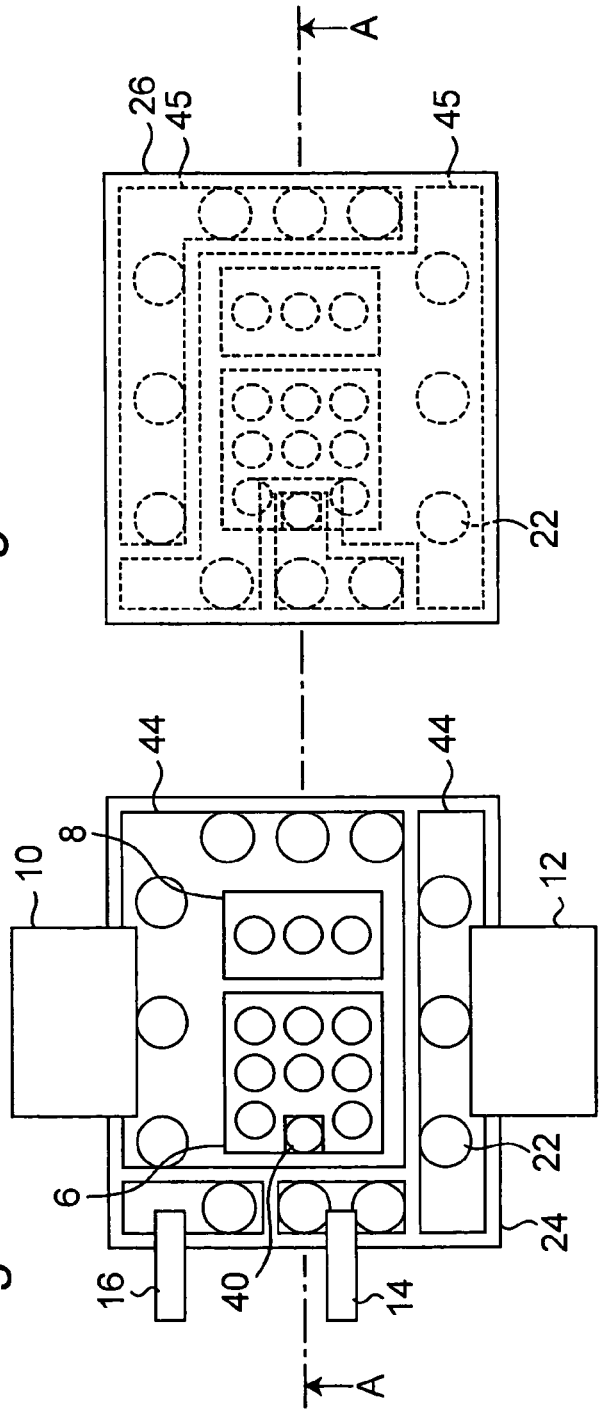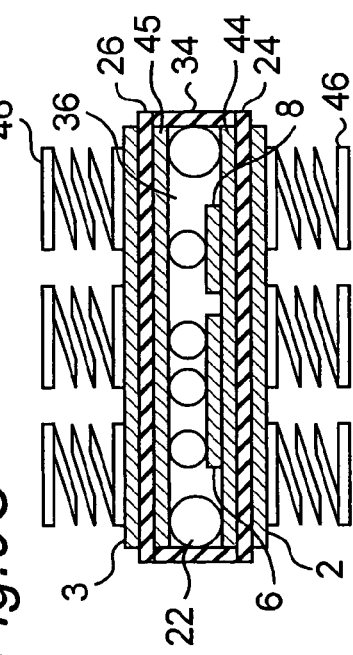

*Fig.10*
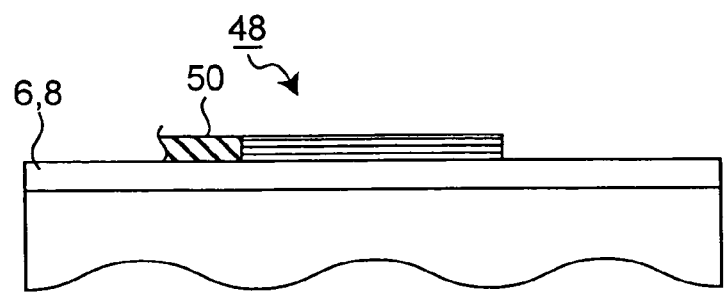
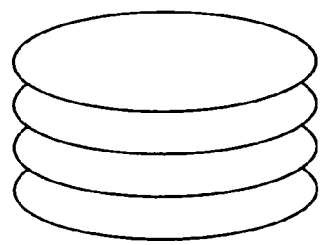
*Fig.11A*
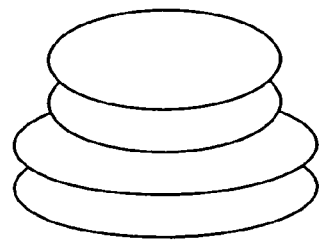
*Fig.11B*
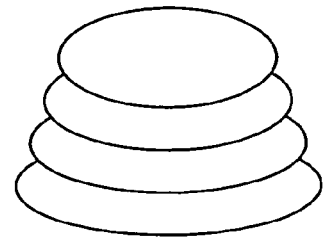
*Fig.11C*

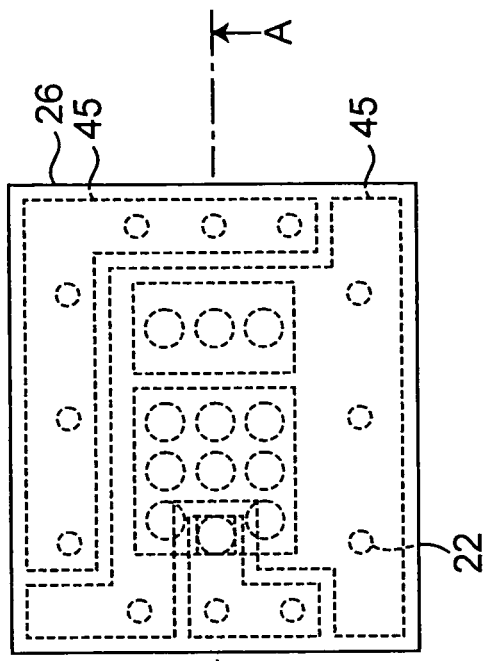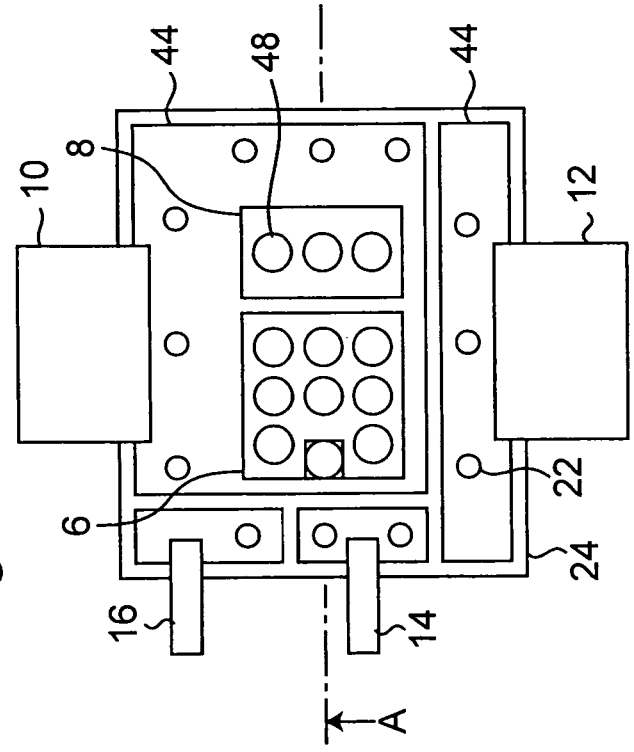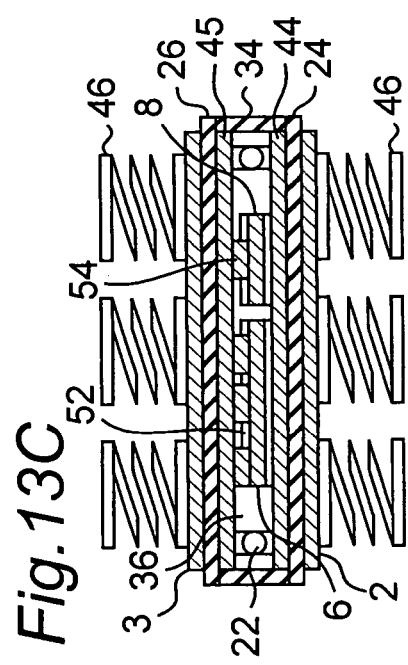

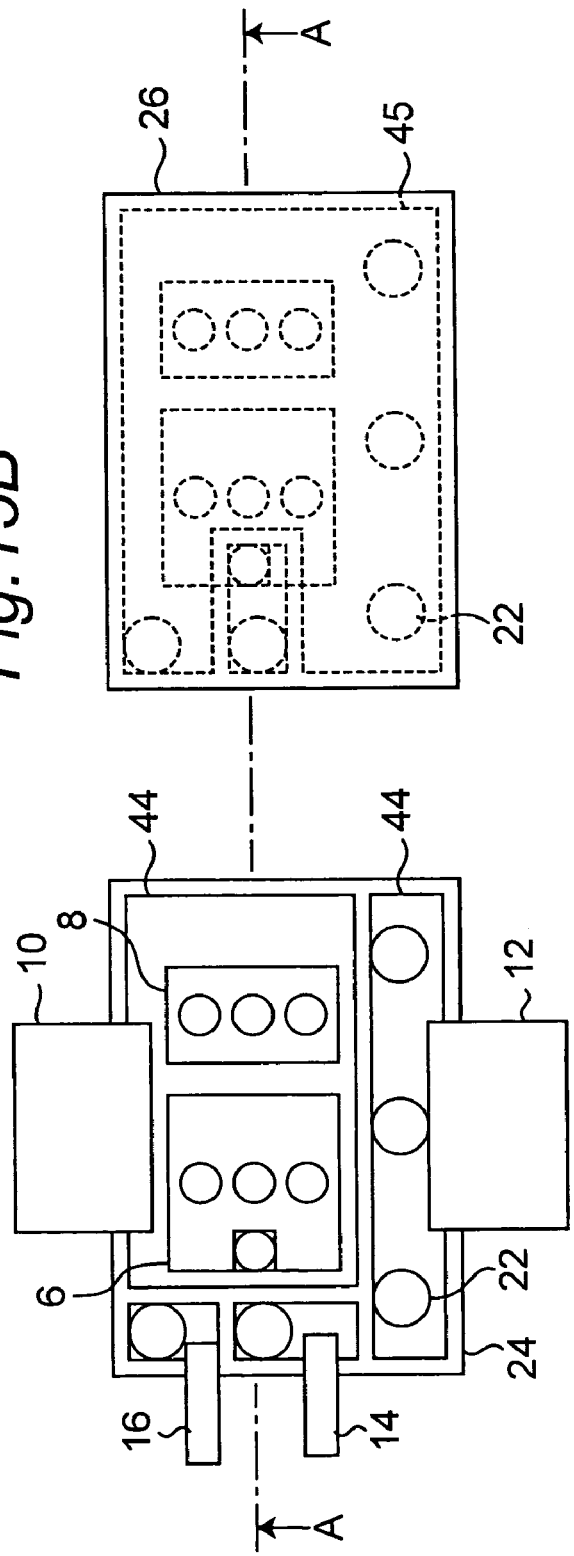
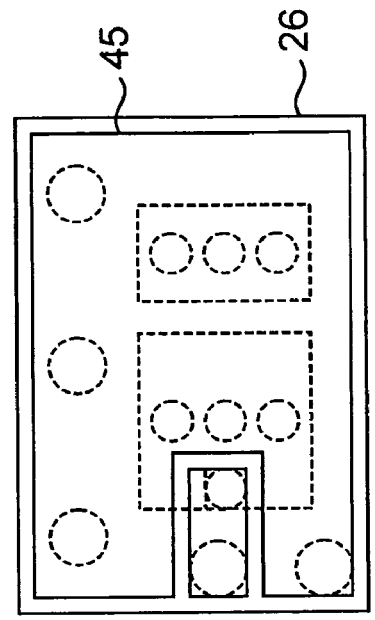
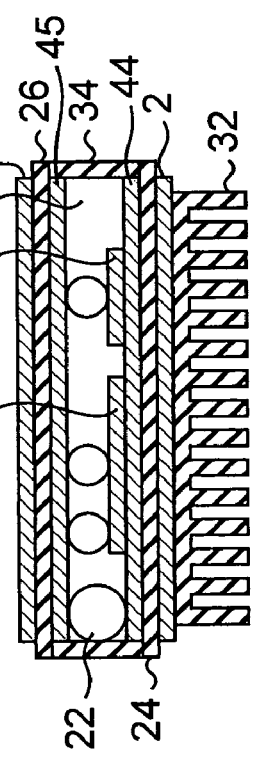

ARRANGEMENT OF CONDUCTIVE CONNECTORS IN A POWER SEMICONDUCTOR DEVICE

BACKGROUND OF THE INVENTION

1) Technical Field of the Invention

The present invention relates to a power semiconductor device incorporating a power semiconductor chip such as an IGBT, MOSFET, and diode.

2) Description of Related Arts

In such a power semiconductor device, electrical connection of the emitter electrode of the IGBT, for example, typically is made through wire-bonding of an aluminum wire, which causes several drawbacks as described below.

Firstly, there is an upper limit for an amount of current that can flow through the thin wire. In order to secure the desired amount of current, the conventional power semiconductor device is designed to have a thicker wire and/or more wires. However, this approach expands the space for wire-bonding, and contradicts the requirement of the device to minimize its size.

Secondly, the thinner wire causes larger impedance. While the thicker wires and more wires in number are adapted for reducing the impedance of the wires, there is still restriction in reducing the impedance as indicated above.

The third drawback is that since current is flows through the interface between the power semiconductor chip and the wire, substantial heat is generated and concentrated at the local area (interface) on the power semiconductor chip. To reduce the concentration of the heat in the conventional art, the area of the interface is extended and/or a plurality of the interfaces are provided at several positions. However, it is difficult to avoid concentration of the heat as thoroughly as desired.

A further problem is that gate oscillation may be caused at an ON-condition of the conventional power semiconductor device. Typically, the power semiconductor chip includes a plurality of cells, each of which has an emitter electrode connected through the wire with a respective one of circuit patterns on an insulating substrate. This structure may lead uneven gate current between the cells at ON-condition, thereby causing breakage or malfunction of the power semiconductor device. Although this problem may be solved by direct connection of each of the cells via wires, the number and areas of bonding-wires have to be increased. Thus, there is still a restriction for eliminating the gate oscillation as the first drawback. In addition, space for connection of wires has to be secured.

While the major drawbacks are described above, there is another issue for radiating heat. According to the conventional power semiconductor device, for example, a base plate is mounted on a radiating fin by means of screws, with grease interposed therebetween, and the heat generated by the semiconductor chip is dissipated only through the radiating fin, of which radiation feature may be insufficient in many cases.

Various power semiconductor devices have been proposed so far, which are disclosed in the Patent Documents as listed below.

Patent Document 1 discloses a power semiconductor device including a signal-system board and a power-system board that are independently produced, and it illustrates a stereoscopic structure in which the control IC chip is mounted on the power IC chip. Patent Document 2 discloses a semiconductor device including a semiconductor chip mounted on an auxiliary board performing a function of a heat sink. According to a power module of Patent Document 3, a semiconductor chip includes an emitter electrode, on which a metal plate having a large surface is mounted for effectively dissipating the heat generated from the semiconductor chip. Patent Document 4 discloses a semiconductor device which effectively radiates the heat from the semiconductor chip through the upper and lower surfaces thereof. Patent Document 5, which has a patent family of U.S. Pat. No. 6,885,096, discloses an IGBT module including the upper and lower external terminals which are connected directly onto the upper and lower electrodes of the IGBT chip, respectively. Also, an insulating layer is provided within the IGBT module for improving insulation. Patent Document 6 provides a power semiconductor module having a spring member for pushing a conductive resin to improve electrical connection of conductive particles within the resin.

Patent Document 1: JP 06-181286, A
Patent Document 2: JP 2000-323630, A
Patent Document 3: JP 2000-068447, A
Patent Document 4: JP 10-056131, A
Patent Document 5: JP 2002-026251, A
Patent Document 6: JP 2000-124398, A Therefore, the present invention has several purposes including for example, provision of a power semiconductor device, in which the amount of main current is increased while the impedance thereof is reduced, heat is dissipated effectively from the semiconductor chip, and the gate oscillation due to the separation of emitter cells of the semiconductor chip is prevented.

SUMMARY OF THE INVENTION

To address the aforementioned drawbacks, one of the aspects of the present invention is to provide a power semiconductor device, including a first substrate having a first circuit pattern formed thereon, and a second substrate having a second circuit pattern formed thereon. The first substrate has a first center line extending along a predetermined transverse direction. At least one power semiconductor chip is mounted on the first circuit pattern of the first substrate, and has at least one chip electrode opposing to the second circuit pattern of the second substrate. Also, a plurality of first conductive connectors on the first circuit pattern is provided for electrical connection with the second circuit pattern of the second substrate. The first conductive connectors are arranged symmetrically in relative to the first center line of the first substrate.

Further scope of applicability of the present invention will become apparent from the detailed description given herein. However it should be understood that the detailed description and specific examples, while indicating preferred embodiments of the invention, are given by way of illustration only, since various changes and modifications within the sprit and scope of the invention will become apparent to those skilled in the art from this detailed description.

BRIEF DESCRIPTION OF THE DRAWINGS

The present invention will be more fully understood from the detailed description given herein and accompanying drawings which are given by way of illustration only, and thus are not limitative of the present invention.

FIGS. 1A-1B are top plan views of the power semiconductor device according to the first embodiment, illustrating the first and second substrates thereof, respectively.

FIGS. 2A-2B are top plan views similar to FIGS. 1A-1B, and FIG. 2C is a perspective view of the bar-like conductive connector.

FIGS. 3A-3B are top plan views of the power semiconductor device according to the second embodiment, illustrating the first and second substrates thereof, respectively.

FIGS. 4A-4B are top plan views similar to FIGS. 3A-3B.

FIGS. 5A-5B are top plan views of the power semiconductor device according to the third embodiment, illustrating the first and second substrates thereof, respectively.

FIGS. 6A-6B are top plan views similar to FIGS. 5A and 5B.

FIGS. 7A-7B are top plan views of the power semiconductor device according to the fourth embodiment, illustrating the first and second substrates thereof, respectively, and FIG. 7C is a cross sectional view taken along a line A-A of FIGS. 7A-7B.

FIGS. 8A-8B are top plan views similar to FIGS. 7A-7B.

FIGS. 9A-9B are top plan views of the power semiconductor device according to the fifth embodiment, illustrating the first and second substrates thereof, respectively, and FIG. 9C is a cross sectional view taken along a line A-A of FIGS. 9A-9B.

FIG. 10 is an enlarged cross sectional view of a metalized member of sixth embodiment.

FIGS. 11A-11C are perspective views of the metalized member showing various sizes thereof.

FIGS. 13A-13B are top plan views and FIG. 13C is a cross sectional view similar to FIGS. 12A-12B, and FIG. 12C, respectively.

FIGS. 15A-15D are a top plan view without a second substrate, a top plan view with the second substrate, a cross sectional view taken along a line A-A, and a bottom view of the power semiconductor device, respectively.

DETAILED DESCRIPTION OF THE PREFERRED EMBODIMENTS

Figure 12A:
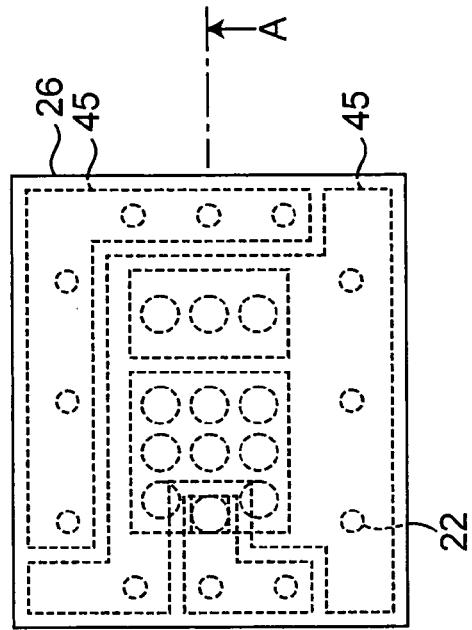
FIGS. 12A-12B are top plan views of the power semiconductor device according to the seventh embodiment, illustrating the first and second substrates thereof, respectively.

Referring to FIGS. 15A-15D, a prototype of a power semiconductor device of the present invention will firstly be described herein, which uses a conductive connector instead of a conductive wire for electrical connection within the device. In the following description, although terminology indicating directions (for example, "upper (top)" and "lower (bottom)") is conveniently used just for clarity, it should not be interpreted that such terminology limits the scope of the present invention.

FIG. 15A is a top plan view of the power semiconductor device which uses the conductive connector instead of the conductive wire, illustrating a first substrate 24 thereof. Also, FIG. 15B is a top plan view illustrating a second substrate 26 with some other components beneath the second substrate 26 being shown by dotted lines. FIG. 15C is a cross sectional view taken along a line A-A of FIGS. 15A-15B. Also, FIG. 15D is a bottom view of the power semiconductor device illustrating the second substrate 26.

As shown in FIG. 15C, the first substrate 24 made of insulating material such as ceramics, which is secured on a base plate 2 of metal, includes a first circuit pattern 44, on which a power switching semiconductor chip 6 such as an IGBT and MOSFET and a free wheel diode 8 are mounted. Thus, the bottom electrodes of the power semiconductor device 6 and free wheel diode 8 are electrically connected with the first circuit pattern 44. In the context of the present specification, the IGBT includes emitter and collector electrodes and the free wheel diode includes anode and cathode electrodes on the upper (top) and lower (bottom) surfaces, respectively. However, it should be noted that the present invention can be applied to the power semiconductor device having the opposite polarity of the electrodes.

Also, as illustrated in FIG. 15C, a second substrate 26 made of insulating material including a second circuit pattern 45 of metal is provided on the lower surface so that the emitter electrode of the power switching semiconductor chip 6 and the anode electrode of the free wheel diode 8 are connected to the second circuit pattern 45 via conductive connectors 22. In FIGS. 15A-15D, the conductive connectors 22 are made in the form of spherical metal. Also electrical connection between the first lower circuit pattern 44 of the first substrate 24 and the second upper circuit pattern 45 of the second substrate 26 is made via a plurality of the conductive connectors 22. In the present specification, the conductive connector formed between the first lower circuit pattern 44 and the second upper circuit pattern 45 is referred to as a "first conductive connector", and the conductive connector formed between the power semiconductor chip 6, 8 and the second upper circuit pattern 45 is referred to as a "second conductive connector".

Adhered on the lower surface of the base plate 2 is a heat sink 32 performing as a heat radiating means. The heat sink 32 may be provided also on the upper surface of the second substrate 26.

Electrical connection between the conductive connectors 22 and the first and second circuit patterns 44, 45, and between the conductive connectors 22 and the upper electrodes of the semiconductor chips (the power switching semiconductor chip 6 and the free wheel diode 8) are made via solder. Such connection may be completed by ultrasonic bonding or pressure bonding.

Also, as illustrated in FIG. 15A, a positive (collector) main terminal 10 is connected with the first circuit pattern 44 on which the semiconductor chips are mounted, and a negative (emitter) main terminal 12 is connected with the first circuit pattern 44 which in turn is connected with the emitter electrode of the power switching semiconductor chip 6 and the anode electrode of the free wheel diode 8 through the conductive connectors 22 and the second circuit pattern 45. Thus, the main current runs from the positive (collector) main terminal 10 to the negative (emitter) main terminal 12 through the power switching semiconductor chip 6, the first and second circuit pattern 44, 45, and the conductive connectors 22. Also, an emitter sense terminal 16 is provided, connecting with the first circuit pattern 44, which also is connected with the emitter electrode of the power switching semiconductor chip 6, for sensing the main current. Further, a gate terminal 14 is provided on the first circuit pattern 44 and connected to the gate electrode of the power semiconductor chip 6 via the conductive connector 22 and the second circuit pattern 45, for supplying a gate signal to the gate electrode.

Partition members 34 cover on and surround the side surface of the power semiconductor device for tightly sealing the space therein. The space defined by the first and second substrates 24, 26 and the partition members 34 is filled up with insulating and heat-resisting gelatinous material 36. For clarity, the gelatinous material 36 is not shown in FIG. 15C with hatching. The second substrate 26 has another base plate 3 of metal on the upper surface.

According to the power semiconductor device shown in FIGS. 15A-15D, the wider connection area of the conductive connectors can advantageously be used for more effective connection, in comparison with the conventional power semiconductor device using conductive wires. Also, the conductive connectors minimize the distance between the second substrate 26 and the first substrate 24 and between the second substrate 26 and the semiconductor chip 6, 8, so that the impedance and the heat of the power semiconductor device is substantially reduced. Further, it is required that the aluminum wires are adapted for connection within the device because of its facility and convenience for mass-production in the prior art. However, since the conductive connectors 22 can readily be used without taking consideration of such requirement in production, they may be made of any material such as copper having higher electrical and thermal conductivity than aluminum. In addition, in case where the power semiconductor chip is the power switching semiconductor chip 6, since the connecting area of the emitter cells with the conductive connector 22 is substantially extended and distance therebetween is fairly reduced, the heat radiation of the power semiconductor chip is improved and the gate oscillation due to the separation of the emitter cells is prevented.

Embodiment 1

Next, referring to FIGS. 1A-1B, and 2A-2C, a power semiconductor device according to the first embodiment of the present invention will be described herein. In general, the power semiconductor device of the first embodiment is similar to the prototype illustrated in FIGS. 15A-15B with some exceptions as described herein. The components shown in FIGS. 1A-1B similar to those in FIGS. 15A-15B have similar reference numerals thereto, and the duplicate description for the similar structure of the first embodiment will be eliminated.

FIG. 1A is a top plan view of the power semiconductor device according to the first embodiment, illustrating the first substrate 24 thereof. Also, FIG. 1B is a top plan view illustrating the second substrate 26 with some other components beneath the second substrate 26 being shown by dotted lines.

As illustrated in FIGS. 1A-1B, the semiconductor device according to the first embodiment includes a plurality of conductive connectors (first conductive connectors) 22 which are arranged on the first circuit pattern 44 at symmetrical positions relative to a center line of the first substrate 24 along the longitudinal direction. The first conductive connectors 22 on the first circuit pattern 44 are also arranged symmetrically relative to another center line along the direction perpendicular to the longitudinal direction.

Also, the conductive connectors 22 on the power semiconductor chips 6, 8 (second conductive connectors) are arranged symmetrically relative to the center line of the first substrate 24 along the longitudinal direction and relative to other center lines of the chips along the direction perpendicular to the longitudinal direction. This arrangement of the conductive connectors 22 allows dispersion of the stress caused by thermal expansion during operation of the device so as to eliminate physically weak points of the device, thereby improving the long-term reliability of the device. Although FIGS. 1A-1B illustrate a gate pad 40 provided in a peripheral edge of the power switching semiconductor chip 6, the gate pad 40 may be arranged on the center of the chip 6 for further improving the symmetry of the conductive connectors 22 on the chip.

The shape of the conductive connectors 22 is not limited to a sphere and may be bar-like (bar-like conductive connector 22') or plate-like as illustrated in FIGS. 2A-2C. While the bar-like conductive connector 22' that is relatively larger than the conductive connectors shown in FIGS. 1A-1D and is integrally formed may receive more stress, the connection strength and radiating efficiency of the bar-like conductive connectors 22' can be improved due to its extended connection area.

The second substrate 26 may be formed of different material than that of the first substrate 24. Since the power semiconductor chips (the power switching semiconductor chip 6 and the free wheel diode 8) are mounted on the first substrate 24, which is likely to be heated more than the second substrate 26, the first substrate 24 may be made of a material having a greater efficient radiating feature to thereby reduce the thermal difference between the first and second substrates 24, 26. For example, the first and second substrates 24, 26 may be made of sintered ceramics of AlN and $Al_2O_3$, respectively. This reduces the difference of thermal expansion between the first and second substrates 24, 26, thereby minimizing the displacement therebetween to improve the reliability of the device.

Embodiment 2

Referring to FIGS. 3A-3B and 4A-4B, a power semiconductor device according to the second embodiment of the present invention will be described herein. The power semiconductor device of the second embodiment has a structure similar to the power semiconductor device of the first embodiment with some exceptions as described herein. The components shown in FIGS. 3A-3B similar to those in FIGS. 1A-1B have similar reference numerals thereto, and the duplicate description for the similar structure of the second embodiment will be eliminated.

FIG. 3A is a top plan view of the power semiconductor device according to the second embodiment, illustrating the first substrate 24 thereof. Also, FIG. 3B is a top plan view illustrating the second substrate 26 with some other components beneath the second substrate 26 being shown by dotted lines.

The power semiconductor device of the second embodiment includes two pairs of the power switching semiconductor chips 6 and the free wheel diodes 8 mounted thereon, the conductive connectors 22 are arranged on the first circuit pattern 44, surrounding the pair of the power semiconductor chips (the power switching semiconductor chip 6 and the free wheel diode 8).

The insulating substrate of the power semiconductor device may warp, especially at the peripheral edge, due to the thermal expansion thereof to bring stress to the power semiconductor chips 6, 8. However, since the power semiconductor device of the second embodiment includes a plurality of conductive connectors 22 at the peripheral edge on the first substrate 24, the stress to the power semiconductor chips 6, 8 can be reduced thereby improving the long-term reliability. The conductive connectors 22 are provided also at position between the power semiconductor chips so that substantial heat from the chips can effectively be dissipated via the second substrate 26.

The power semiconductor device of FIGS. 4A-4B includes two pairs of the power switching semiconductor chips 6 and the free wheel diodes 8 similar to one of FIGS. 3A-3B, however, the first substrate 24 is divided into two pieces. Division of the first substrate 24 facilitates assembly of the device even where the circuit structure is complicated, and adjusts the radiating efficiency of the device. Also, while the first substrate 24 is more likely damaged (cracked) due to the warpage of the substrate as larger in size, the crack can be prevented by dividing the first substrate 24 into pieces appropriately.

It should be noted that the second substrate 26 may be divided, and the first and second substrates 26, 28 may be divided into three or more pieces.

Embodiment 3

Referring to FIGS. 5A-5B and 6A-6B, a power semiconductor device according to the third embodiment of the present invention will be described herein. The power semiconductor device of the third embodiment has a structure similar to the power semiconductor device of the first embodiment with some exceptions as described herein. The components shown in FIGS. 5A-5B similar to those in FIGS. 1A-1B have similar reference numerals thereto, and the duplicate description for the similar structure of the aforementioned embodiments will be eliminated.

FIG. 5A is a top plan view of the power semiconductor device according to the third embodiment, illustrating the first substrate 24 thereof. Also, FIG. 5B is a top plan view illustrating the second substrate 26 with some other components beneath the second substrate 26 being shown by dotted lines.

In the power semiconductor device of the third embodiment, a plurality of the emitter sense terminals are provided, connecting with the first circuit pattern 44 and the emitter electrode of the power switching semiconductor chip 6 via the conductive connectors 22, for sensing the main current through the power switching semiconductor chip 6. Conventionally, a single emitter sense terminal through a conductive wire may sense varying voltages depending upon the connecting positions of the emitter electrode of the power switching semiconductor chip 6. However, the device of the present embodiment has several emitter sense terminals at different positions so that the appropriate one of the emitter sense terminals can be selected in accordance with the application and condition of use.

Also, as the first circuit pattern 44 of the first substrate 24 is designed to have a wider area, greater design flexibility to choose the position of the emitter sense terminal can be realized.

Besides the gate terminal 14 and the emitter sense terminal 16, the power semiconductor device may include other external lead terminals such as a temperature sense terminal 38, as illustrated in FIG. 6A. In this instance, those external lead terminals (the gate terminal 14, the emitter sense terminal 16, and the temperature sense terminal 38) may be arranged at one peripheral side of the first and second substrates 24, 26, which facilitates the manufacturing process of the semiconductor device to improve throughput of the device and the assembling work of the device into other peripheral devices.

Embodiment 4

Referring to FIGS. 7A-7C and 8A-8B, a power semiconductor device according to the fourth embodiment of the present invention will be described herein. The the power semiconductor device of the fourth embodiment has a structure similar to the power semiconductor device of the first embodiment with some exceptions as described herein. The components shown in FIGS. 7A-7C similar to those in FIGS. 1A-1B have similar reference numerals thereto, and the duplicate description for the similar structure of the aforementioned embodiments will be eliminated.

FIG. 7A is a top plan view of the power semiconductor device according to the fourth embodiment, illustrating the first substrate 24 thereof. Also, FIG. 7B is a top plan view illustrating the second substrate 26 with some other components beneath the second substrate 26 being shown by dotted lines. FIG. 7C is a cross sectional view taken along a line A-A of FIGS. 7A-7B.

The first and second circuit patterns 44, 45 on the first and second substrates 24, 26 are made in substantially flat form in the aforementioned embodiments. Meanwhile, the first and second circuit patterns 44, 45 of the present embodiment includes one or more first and second boss members protruding from the upper surface of the first substrate 24 and from the lower surface of the second substrate, respectively. The first boss members support the power semiconductor chips (the power switching semiconductor chip 6 and the free wheel diode 8) and the conductive connectors 22, and the second boss members hold the conductive connectors 22. Thus, as shown in FIG. 7C, a plurality of connecting portions 46 contacting with the first and second substrates 24, 26, are defined between the adjacent first boss members and the second boss members, respectively.

According to the power semiconductor device having the circuit patterns so structured, the stress applied to the connecting portions 46 can be absorbed by the other portions of the substrates, thereby to enhance the long-term reliability of the device.

In general, while the circuit patterns are provided on the rectangular area of the substrate, a portion of the circuit pattern may extend beyond the substrate and the extended portion of the circuit pattern may be used as an external terminal. FIGS. 8A-8B illustrate an example of the circuit patterns (the first and second circuit patterns 44, 45) having the extended portions, which are used as the external terminals. This structure of the circuit patterns can reduce the total number of the components for manufacturing the device.

Embodiment 5

Referring to FIGS. 9A-9C, a power semiconductor device according to the fifth embodiment of the present invention will be described herein. The power semiconductor device of the fifth embodiment has a structure similar to the power semiconductor device of the first embodiment with some exceptions as described herein. The components shown in FIGS. 9A-9C similar to those in FIGS. 1A-1B have similar reference numerals thereto, and the duplicate description for the similar structure of the aforementioned embodiments will be eliminated.

FIG. 9A is a top plan view of the power semiconductor device according to the fifth embodiment, illustrating the first substrate 24 thereof. Also, FIG. 9B is a top plan view illustrating the second substrate 26 with some other components beneath the second substrate 26 being shown by dotted lines. FIG. 9C is a cross sectional view taken along a line A-A of FIGS. 9A-9B.

According to the power semiconductor device of the first embodiment, the heat sink 32 performing as a heat radiating means is provided beneath the base plate 2. In the meantime, a plurality of biasing members such as springs 46 are provided on the lower surface of the lower base plate 2 beneath the first substrate 24 and on the upper surface of the upper base plate 3 on the second substrate 26. The power semiconductor device of the fifth embodiment with a plurality of the springs 46 is received within a box-like hollow housing (not shown), and the springs 46 are depressed by the inner walls of the housing for supporting the power semiconductor device within the housing.

Thus, the power semiconductor device of the fifth embodiment is biased by and sandwiched between several springs opposed to each other. When the solder is melted due to heat generated during the operation of the device, any connecting portions by means of solder maintains the electrical connection in a liquid phase of solder. Also advantageously, the melting solder cures and eliminates the cracks existing in the solder. Further, when the power semiconductor device is damaged or broken, the springs bias and pinch the collector and emitter electrodes of the power switching semiconductor chip 6 to cause a short circuit rather an open circuit. In general, the open circuit of the device likely leads to a more harmful situation than the short circuit. The power semiconductor device according to the present embodiment allows current to keep running through the device during DC operation, even if the device fails.

In addition, the springs 46 may be connected directly or indirectly with the first and second substrates 24, 26 and formed of appropriate metal so as to also perform a function of a radiator for dissipating heat generated from the power semiconductor chips.

Embodiment 6

Referring to FIGS. 10 and 11A-11C, a power semiconductor device according to the sixth embodiment of the present invention will be described herein. The power semiconductor device of the sixth embodiment has one of the main features in a metalized member, which is, in this context of the specification, a thin-layer stack of metal formed on the upper surface of the power semiconductor chips and/or the circuit patterns for electrical connection with solder, as illustrated in FIG. 10. Although not limited thereto, the metalized member 48 has a configuration of column, and formed by any appropriate deposition process. In the foregoing embodiments, the conductive connectors 22 are connected with the power semiconductor chips (the power switching semiconductor chip 6 and the free wheel diode 8) via the metalized member 48.

The metalized member 48 includes, in general, three to five thin layers of metal. In FIG. 10, the metalized member 48 includes aluminum (Al), molybdenum (Mo), nickel (Ni), and gold (Au) layers subsequently formed on the chip surface. While those metal layers typically have subsequently the same horizontal size (i.e., the area), as illustrated in FIG. 11A, each of the metal layers is designed to be different from the other metal layers in the power semiconductor device of the present embodiment. In the metalized member 48 composed of aluminum (Al), molybdenum (Mo), nickel (Ni), and gold (Au) layers shown in FIG. 11B, the upper two layers (i.e., two layers closer to the power semiconductor chip) of nickel (Ni) and gold (Au) are smaller than the lower two layers of aluminum (Al) and molybdenum (Mo). Alternatively, the layer that is closer to the power semiconductor chip may be larger than the layer that is farther from the power semiconductor chip as shown in FIG. 11C. This prevents the upper layer from being formed beyond the region outside the lower layer, which is referred to as offset deposition, and facilitates precise deposition of the upper layer on the lower layer.

When the conductive connector 22 is connected with the metalized member 48 by means of solder, the aluminum layer and the nickel layer are partially fused and the conductive connector 22 gets in the nickel layer for connection. In this instance, the partially fused portion of the aluminum layer and the nickel layer likely overflows beyond the molybdenum layer and the aluminum layer thereby to cause the short circuit between the adjacent electrodes such as emitter electrode and the gate electrode on the chip, which is referred to as blur connection. However, according to the present embodiment, the offset deposition and the blur connection can be prevented since the upper layer(s) is/are smaller than the lower layer(s).

Also, as the conductive connectors 22 are securely connected with the metalized member 48, the long-term reliability of the device is also improved.

Further, as illustrated in FIG. 10, the peripheral portion 50 of the metalized member 48 is formed of heat-resisting material such as polyimide. This further reduces the offset deposition and the blur connection of the uppers layers (gold (Au) and nickel (Ni) layers) of the metalized member 48 when the conductive connectors 22 are soldered.

Embodiment 7

Referring to FIGS. 12A-12C and 13A-13C, a power semiconductor device according to the seventh embodiment of the present invention will be described herein. The power semiconductor device of the seventh embodiment has a structure similar to the power semiconductor device of the first embodiment with some exceptions as described herein. The components shown in FIGS. 12A-12C similar to those in FIGS. 1A-1B have similar reference numerals thereto, and the duplicate description for the similar structure of the aforementioned embodiments will be eliminated.

Figure 12B:
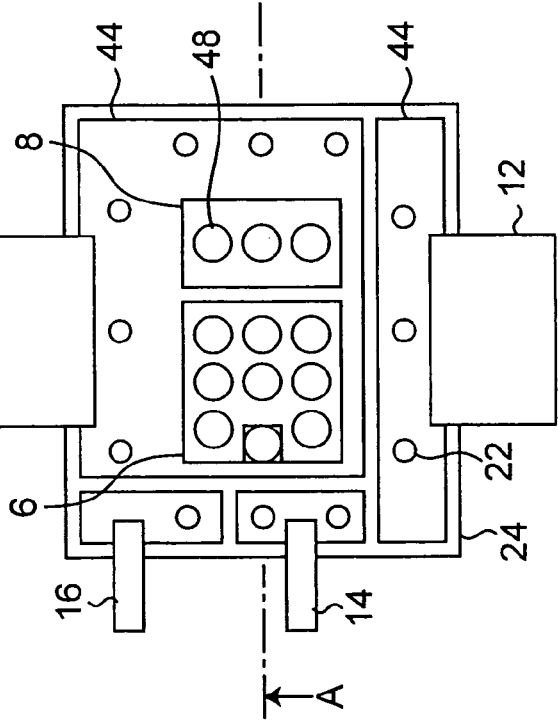
Figure 12C:
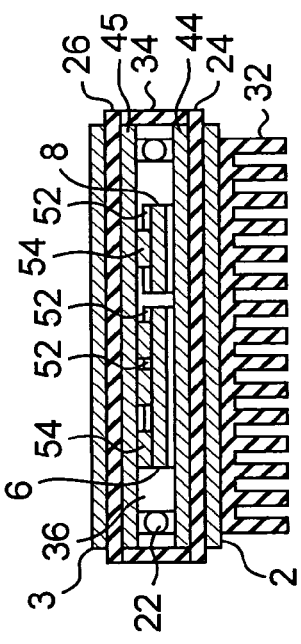
FIG. 12C is a cross sectional view taken along a line A-A of FIGS. 9A-9B.

FIG. 12A is a top plan view of the power semiconductor device according to the seventh embodiment, illustrating the first substrate 24 thereof. Also, FIG. 12B is a top plan view illustrating the second substrate 26 with some other components beneath the second substrate 26 being shown by dotted lines. FIG. 12C is a cross sectional view taken along a line A-A of FIGS. 12A-12B.

In the power semiconductor device of the seventh embodiment, instead of the conductive connectors 22, the metalized members 48 both on the second circuit pattern 45 and the chip electrode are used to provide a connection member 54 for direct connection between the chip electrode and the second circuit pattern 45 of the second substrate 26. The upper surface of the power semiconductor chip is covered with heat-resisting material 52 such as polyimide in the areas other than where the metalized members 48 are formed. Meanwhile, the metalized members 48 formed on the first circuit pattern 44 are electrically connected with the second circuit pattern 45 via the conductive connectors 22 as in the first embodiment.

According to the seventh embodiment, no conductive connector 22 is provided and the metalized member 48 is thin enough so as to quickly dissipate heat generated by the power semiconductor chip to the second circuit pattern 45, and to reduce the thermal stress between the metalized member 48 and the power semiconductor chip (and/or the second circuit pattern 45) due to the difference of the thermal expansion coefficients, that is less than one between the conductive connectors 22 and the power semiconductor chip (and/or the second circuit pattern 45). Also, upon eliminating the impacts of the conductive connector 22 including the electric resistance and the thermal resistance thereof, the thermal gap between the upper and lower substrates 24, 26 is reduced to minimize the thermal stress of the device as a whole. This substantially improves the long-term reliability of the device. In addition, since the conductive connector 22 is not required, the total number of components can be reduced. Further, when the power switching semiconductor chip is the IGBT or MOSFET which has a guard-ring at a peripheral edge on the chip, the heat-resisting resin may cover the peripheral edge to improve the insulating ruggedness and reduce leak current.

While the power semiconductor device of FIG. 12 includes the power switching semiconductor chip 6 and the free wheel diode 8, a reverse-conducting IGBT (not shown) may be used, which eliminates the necessity of the diode and has the electrical characteristics of an ideal (improved) inductance balance.

Similar to the springs 46 of the fifth embodiment, the power semiconductor device of the seventh embodiment has the springs 46 on the base plates 2, 3 as illustrated in FIG. 13C.

Embodiment 8

Figure 14:
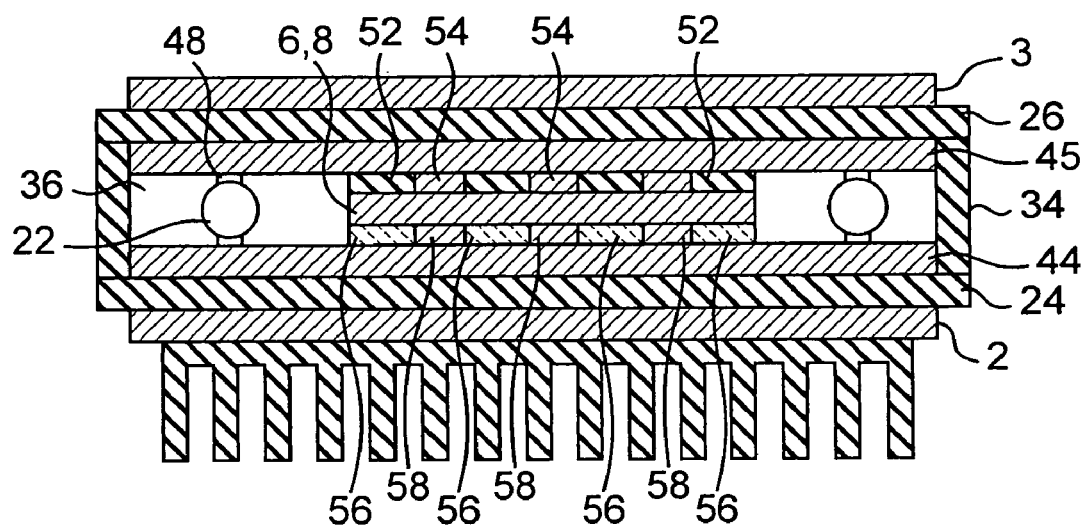
FIG. 14 is a cross sectional view of the power semiconductor device according to the eighth embodiment.

Referring to FIG. 14, a power semiconductor device according to the eighth embodiment of the present invention will be described herein. The power semiconductor device of the eighth embodiment has a structure similar to the power semiconductor device of seventh embodiment with some exceptions as described herein. The components shown in FIG. 14 similar to those in FIG. 12C have similar reference numerals thereto, and the duplicate description for the similar structure of the aforementioned embodiments will be eliminated.

Similar to the seventh embodiment, the power semiconductor device of the eighth embodiment uses the metalized member 48, instead of the conductive connectors 22, to provide a connection member 54 for direct connection between the chip electrode and the second circuit pattern 45 of the second substrate 26. The upper surface of the power semiconductor chip is covered with heat-resisting material 52 such as polyimide in the areas other than where the metalized members 48 are formed. Meanwhile, the metalized members 48 formed on the first circuit pattern 44 are electrically connected with the second circuit pattern 45 via the conductive connectors 22 as in the first embodiment.

In addition, the power semiconductor device of the eighth embodiment includes a plurality of soldering portions 58 on the bottom surface of the power semiconductor chip 6, 8 for connecting with the first circuit pattern 44. In other words, the power semiconductor device includes a plurality of void regions 56 defined by the soldering portions 58, the bottom surface of the power semiconductor chip, and the first circuit pattern 44. Each of the void regions 56 may be formed, for example, by applying a solder resist at positions where the soldering portions 58 are not formed.

Formation of the void regions 56 between the power semiconductor chip and the first circuit pattern 44 controls the amount of heat generated by the chip to be dissipated from the first and second substrates 24, 26. Thus, the amount of heat can be controlled such that the first and second substrates 24, 26 are not displaced by the warpage due to the difference of the thermal expansion. Therefore, the reliability of the semiconductor device can further be improved.

Also, each of the soldering portions 58 may be formed opposing to and beneath the respective one of the connection members 54. Alignment of the positions of the soldering portion 58 and the connection member 54 improves the radiating efficiency of the power semiconductor device.

What is claimed is:

1. A power semiconductor device, comprising:
   a first substrate having a first circuit pattern formed thereon with a first center line extending along a predetermined transverse direction;
   a second substrate having a second circuit pattern formed thereon, the second circuit pattern opposing the first circuit pattern of said first substrate;
   at least one power semiconductor chip mounted on the first circuit pattern of said first substrate, the power semiconductor chip having at least one chip electrode opposing the second circuit pattern of said second substrate; and
   a plurality of first conductive connectors in contact with the first circuit pattern of said first substrate and the second circuit pattern of said second substrate for electrically connecting the first circuit pattern and the second circuit pattern to each other;
   wherein said first conductive connectors are arranged symmetrically relative to the first center line of said first substrate, and
   wherein at least one of said first conductive connectors is arranged on the first circuit pattern on which said power semiconductor chip is mounted, so that substantial heat generated from said power semiconductor chip is dissipated to the second circuit via the first circuit pattern and said at least one of said first conductive connectors.

2. The power semiconductor device according to claim 1, wherein said first substrate has a second center line perpendicular to the first center line, and
   wherein said first conductive connectors are arranged symmetrically relative to the second center line of said first substrate.

3. The power semiconductor device according to claim 1, further comprising:
   a plurality of second conductive connectors on the chip electrode of said power semiconductor chip for electrical connection with the second circuit pattern of said second substrate, and
   wherein said second conductive connectors are arranged symmetrically relative to the first center line of said first substrate.

4. The power semiconductor device according to claim 1, wherein said first conductive connectors surround said power semiconductor chip.

5. The power semiconductor device according to claim 1, wherein the first circuit pattern includes at least one first boss member protruding from said first substrate, for supporting at least one of said power semiconductor chip and at least one of said first conductive connectors.

6. The power semiconductor device according to claim 1, wherein said first substrate is made of a different material than said second substrate.

7. The power semiconductor device according to claim 1, wherein at least one of said first substrate and said second substrate is divided into a plurality of pieces.

8. The power semiconductor device according to claim 1, further comprising a plurality of emitter sense terminals extending from different positions from one another.

9. The power semiconductor device according to claim 1, further comprising a plurality of external lead terminals extending from one peripheral side of said first substrate.

10. The power semiconductor device according to claim 1, wherein at least one of the first and second circuit patterns has at least one extended portion externally extending from said first and second substrates.

11. The power semiconductor device according to claim 1, further comprising a spring provided on at least one of said first and second substrates for biasing said first and second substrates to each other.

12. The power semiconductor device according to claim 1, further comprising:
   a plurality of metalized members for electrical connection between the chip electrode of said power semiconductor chip and the second circuit pattern of said second substrate;
   wherein each of said metalized members includes a plurality of thin layers of metal, at least one of the thin layers having a different size from the other layers.

13. The power semiconductor device according to claim 1, further comprising:
   a plurality of metalized members for electrical connection between the chip electrode of said power semiconductor chip and the second circuit pattern of said second substrate, each of said metalized members having a plurality of thin layers of metal; and
   a plurality of peripheral portions made of heat resisting material surrounding said metalized members.

14. The power semiconductor device according to claim 1, wherein said power semiconductor chip includes a power switching semiconductor chip and a free wheel diode.

15. The power semiconductor device according to claim 1, wherein said plurality of first conductive connectors are in direct contact with the first circuit pattern of said first substrate and in direct contact with the second pattern of said second substrate.

16. The power semiconductor device according to claim 3, wherein at least one of said first and second conductive connectors has a bar-like configuration.

17. The power semiconductor device according to claim 3, wherein the second circuit pattern includes at least one second boss member protruding from said second substrate, for supporting at least one of said first and second conductive connectors.

18. The power semiconductor device according to claim 8, wherein said plurality of emitter terminals each extend from different positions on the first circuit pattern away from an area of the first circuit pattern on which said power semiconductor chip is mounted.

19. The power semiconductor device according to claim 12, wherein the thin metal layer of the metalized members in contact with the chip electrode of said power semiconductor chip and the thin metal layer of the metalized members in contact with the second circuit pattern of said second substrate are smaller than the other thin layers to prevent offset deposition.

20. A power semiconductor device, comprising:
   first and second substrates having first and second circuit patterns formed thereon, respectively, the first circuit pattern of said first substrate opposing the second circuit pattern of said second substrate;
   at least one power semiconductor chip mounted on the first circuit pattern of said first substrate, the power semiconductor chip having at least one chip electrode opposing the second circuit pattern of said second substrate;
   metalized members respectively formed on each of the chip electrode and the second circuit pattern of said second substrate, each of the metalized members having a plurality of independent thin layers of metal;
   a connection member connecting the metalized members formed on the chip electrode to the metalized members formed on the second circuit pattern by means of solder; and
   a heat-resisting member covered on said power semiconductor chip in an area other than where the metalized members are formed.

21. The power semiconductor device according to claim 20, wherein said power semiconductor chip includes a power switching semiconductor chip and a free wheel diode.

22. The power semiconductor device according to claim 20, further comprising a plurality of soldering portions formed between the first circuit pattern of said first substrate and said power semiconductor chip, the plurality of soldering portions defining a plurality of void regions among the soldering portions, said power semiconductor chip, and the first circuit pattern of said first substrate.

23. The power semiconductor device according to claim 22, further comprising a plurality of the connection members connecting the metalized members formed on the chip electrode to the metalized members formed on the second circuit pattern by means of solder,
   wherein each of the soldering portions is respectively aligned to one of the connection members.

24. The power semiconductor device according to claim 20, further comprising a plurality of conductive connectors in contact with the first circuit pattern of said first substrate and the second circuit pattern of said second substrate for electrically connecting the first circuit pattern and the second circuit pattern to each other.

25. The power semiconductor device according to claim 24, wherein the plurality of conductive connectors are arranged symmetrically relative to a center line of said first substrate extending along a predetermined transverse direction.

* * * * *